(12) United States Patent
Lee

(10) Patent No.: US 8,119,444 B2
(45) Date of Patent: Feb. 21, 2012

(54) METHOD FOR MANUFACTURING THE IMAGE SENSOR

(75) Inventor: Min-Hyung Lee, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 178 days.

(21) Appl. No.: 12/633,619

(22) Filed: Dec. 8, 2009

(65) Prior Publication Data
US 2010/0164033 A1    Jul. 1, 2010

(30) Foreign Application Priority Data
Dec. 30, 2008 (KR) .................. 10-2008-0136315

(51) Int. Cl.
*H01L 21/00* (2006.01)
(52) U.S. Cl. ........ 438/98; 438/75; 438/69; 257/E21.079
(58) Field of Classification Search .............. 438/98, 438/69, 75; 257/E21.079
See application file for complete search history.

(56) References Cited

U.S. PATENT DOCUMENTS

| 5,936,261 | A  | * | 8/1999 | Ma et al. ...................... 257/59 |
| 6,396,118 | B1 | * | 5/2002 | Theil et al. ................... 257/444 |
| 6,798,033 | B2 | * | 9/2004 | Chao et al. ................... 257/444 |
| 7,101,726 | B2 | * | 9/2006 | Yamamoto et al. .......... 438/69 |

* cited by examiner

*Primary Examiner* — Thanh Nguyen
(74) *Attorney, Agent, or Firm* — Sherr & Vaughn, PLLC

(57) ABSTRACT

An image sensor and a method of manufacturing an image sensor. An image sensor may include a semiconductor substrate which may include a readout circuitry. An image sensor may include an interlayer dielectric over a semiconductor substrate, and/or a first metal pattern over an interlayer dielectric. An interconnection may penetrate an interlayer dielectric and/or may be connected to a readout circuitry. A first metal pattern may be formed over an interlayer dielectric, and/or may be connected to an interconnection. A second metal pattern may be formed over a first metal pattern. A photodiode pattern may be formed over a second metal pattern.

11 Claims, 4 Drawing Sheets

… (1)

METHOD FOR MANUFACTURING THE IMAGE SENSOR

Figure 1:
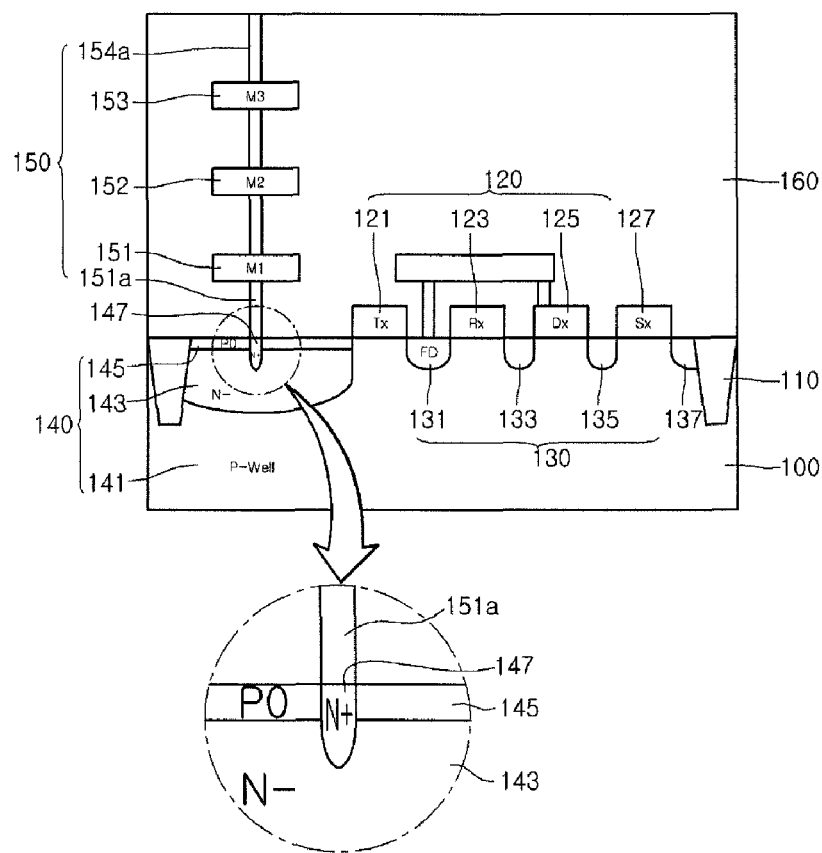

The present application claims priority under 35 U.S.C. 119 to Korean Patent Application No. 10-2008-0136315 (filed on Dec. 30, 2008) which is hereby incorporated by reference in its entirety.

BACKGROUND

Embodiments relate to an image sensor and a method of manufacturing an image sensor.

Image sensors may include semiconductor devices which may convert optical images into electrical signals. Image sensors may be classified as charged coupled devices (CCDs) and/or complementary metal oxide semiconductor (CMOS) image sensors (CIS). CMOS image sensors may have structure in which a photodiode region, which may convert optical signals into electrical signals, and a transistor region, which may process electrical signals, may be horizontally disposed. A horizontal type image sensor may include a photodiode region and/or a transistor region horizontally disposed on and/or over a semiconductor substrate, such that there may be a drawback in expanding an optical sensing part, which may reference a fill factor, due to a relatively limited area.

To address drawbacks, attempts of forming a photodiode using amorphous silicon (Si), and/or forming a circuitry on and/or over a silicon (Si) substrate and/or forming a photodiode on and/or over a readout circuitry using a wafer-to-wafer bonding method may be attempted, which may reference a three-dimensional (3D) image sensor. A photodiode may be connected to circuitry through a metal interconnection. However, since a bonding surface between wafers in wafer-to-wafer bonding may be relatively uneven, bonding strength may be reduced. Relatively slight height differences may be generated according to positions on and/or over a surface of a wafer including a circuitry and/or an interconnection as a semiconductor processes may be repeatedly performed. When a wafer including a circuitry and/or an interconnection may be bonded to a wafer including a photodiode, mutual bonding strength may be minimized A peeling phenomenon may result.

Accordingly, there is a need for an image sensor and a method of manufacturing an image sensor which may include a vertical-type image sensing device and/or form a metal layer on and/or over a bonding surface between an image sensing device and an interlayer dielectric, for example to maximize bonding strength.

SUMMARY

Embodiments relate to an image sensor and a method of manufacturing an image sensor. According to embodiments, an image sensor and a method of manufacturing an image sensor may include a vertical-type image sensing device and/or form a metal layer on and/or over a bonding surface between an image sensing device and an interlayer dielectric. In embodiments, bonding strength may be maximized.

According to embodiments, an image sensor may include a semiconductor substrate having a readout circuitry for each unit pixel. In embodiment, an image sensor may include an interlayer dielectric on and/or over a semiconductor substrate. In embodiment, an image sensor may include an interconnection penetrating through an interlayer dielectric and/or connected to a readout circuitry. In embodiment, an image sensor may include a first metal pattern on and/or over an interlayer dielectric, and/or a first metal pattern connected to an interconnection. In embodiment, an image sensor may include a second metal pattern on and/or over a first metal pattern. In embodiment, an image sensor may include a photodiode pattern on and/or over a second metal pattern.

According to embodiment, a method of manufacturing an image sensor may include forming a readout circuitry on and/or over a semiconductor substrate for each unit pixel. In embodiments, a method of manufacturing an image sensor may include forming an interlayer dielectric on and/or over a semiconductor substrate. In embodiments, a method of manufacturing an image sensor may include forming an interconnection penetrating through an interlayer dielectric and/or connected to a readout circuitry. In embodiments, a method of manufacturing an image sensor may include forming a first metal pattern on and/or over an interlayer dielectric.

According to embodiments, a method of manufacturing an image sensor may include forming an image sensing device by performing an ion implantation process on and/or over a carrier wafer. In embodiments, a method of manufacturing an image sensor may include forming a second metal pattern on and/or over a surface of an image sensing device. In embodiments, a method of manufacturing an image sensor may include performing a bonding process on and/or over a first and/or a second metal layer, which may bond an image sensing device to a semiconductor substrate. In embodiments, a method of manufacturing an image sensor may include separating a carrier wafer from an image sensing device to expose a surface of an image sensing device. In embodiments, a method of manufacturing an image sensor may include forming a pixel isolation layer through an image sensing device, a second metal layer and/or a first metal layer, which may separate an image sensing device into pixels.

DRAWINGS

Example FIG. 1 to FIG. 9 are cross-sectional views illustrating a method of manufacturing an image sensor in accordance with embodiments.

DESCRIPTION

Embodiments relate to an image sensor and a method of manufacturing an image sensor. Embodiments are not limited to a CMOS image sensor. Embodiments may be applied, for example, to all image sensors that may use a photodiode such as a CCD image sensor.

Embodiments relate to an image sensor. Referring to example FIG. 9, a cross-sectional view illustrates an image sensor in accordance with embodiments. According to embodiments, semiconductor substrate 100 may include readout circuitry 120 formed for each unit pixel. In embodiments, interlayer dielectric 160 may be formed on and/or over semiconductor substrate 100. In embodiments, interconnection 150 may penetrate through interlayer dielectric 160 and/or may be connected to readout circuitry 120.

According to embodiments, first metal pattern 175 may be formed on and/or over interlayer dielectric 160. In embodiments, first metal pattern 175 may be connected to interconnection 150. In embodiments, second metal pattern 245 may be formed on and/or over first metal pattern 175. In embodiments, photodiode pattern 205 may be formed on and/or over second metal pattern 245.

According to embodiments, first metal pattern 175 and/or second metal pattern 245 may include Ti, Ta, Co, Al, Sn, Cu, Pb and/or Ag. In embodiments, first metal pattern 175 and/or second metal pattern 245 may include a combination of materials, including at least two of the above-described materials.

In embodiments, first metal pattern 175 and/or second metal pattern 245 may be used as bonding layers, for example between interlayer dielectric 160 and photodiode pattern 205. In embodiments, physical and/or electrical bonding strength between interlayer dielectric 160 and photodiode pattern 205 may be maximized. In embodiments, first metal pattern 175 and/or second metal pattern 245 may be separated into unit pixels according to photodiode pattern 205. In embodiments, transmission efficiency of photocharges may be maximized.

According to embodiments, photodiode pattern 205 may have a junction structure including first doped layer 210, for example doped with N-type impurities, and second doped layer 220, for example doped with P-type impurities. In embodiments, pixel isolation layer 260 may be formed at a sidewall of first metal pattern 175 and/or photodiode pattern 205. In embodiments, photodiode pattern 205 may be separated into unit pixels. In embodiments, photodiode pattern 205, first metal patters 175 and/or second metal pattern 245 may be separated into unit pixels.

Embodiments relate to a method of manufacturing an image sensor. Referring to example FIG. 1 to FIG. 9, cross-sectional views illustrate a method of manufacturing an image sensor in accordance with embodiments. Referring to FIG. 1, interconnection 150 and/or interlayer dielectric 160 may be formed on and/or over semiconductor substrate 100, which may include readout circuitry 120. According to embodiments, semiconductor substrate 100 may include a mono- and/or poly-crystalline silicon substrate, and/or may be a substrate doped with P-type impurities and/or N-type impurities.

According to embodiments, device isolation layer 110 may be formed on and/or over semiconductor substrate 100, which may define an active region in which readout circuitry 120 including transistors may be formed. In embodiments, readout circuit 120 may include transfer transistor (Tx) 121, reset transistor (Rx) 123, drive transistor (Dx) 125 and/or select transistor (Sx) 127. According to embodiments, ion implantation region 130 may include floating diffusion region (FD) 131 and source/drain regions 133, 135 and/or 137 for each transistor. In embodiments, readout circuitry 120 may be applied to a 3Tr and/or 5Tr structure.

According to embodiments, forming readout circuitry 120 on and/or over semiconductor substrate 100 may include forming electrical junction region 140 on and/or over first substrate 100 and/or forming poly contact 147 connected to the interconnection 150 on and/or over electrical junction region 140. In embodiments, electrical junction region 140 may be a P-N junction 140, but embodiments are not limited thereto. In embodiments, electrical junction region 140 may include first conductive type ion implantation layer 143 formed on and/or over second conductive type well 141 and/or a second conductive type epitaxial layer. In embodiments, electrical junction region 140 may include second conductive type ion implantation layer 145 formed on and/or over first conductive type ion implantation layer 143. In embodiments, P-N junction 140 may be a P0(145)/N-(143)/P-(141) junction, but embodiments are not limited thereto. In embodiments, semiconductor substrate 100 may include a second conductive type, but embodiments are not limited thereto.

Figure 2:
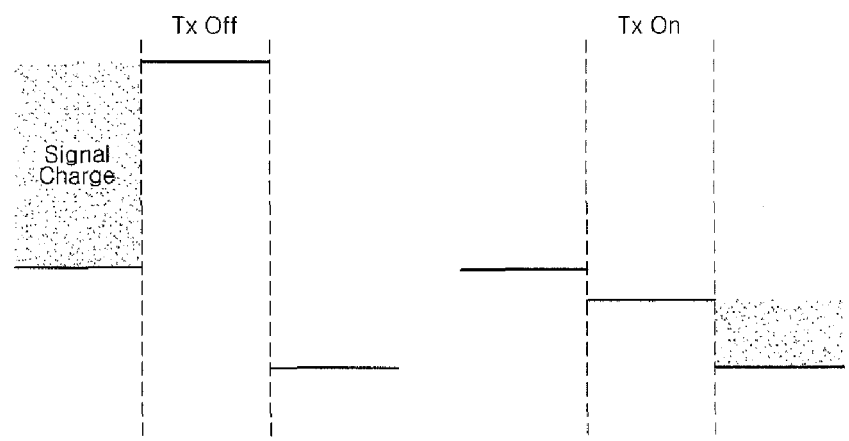

According to embodiments, a device may be designed to provide a potential difference between a source and a drain of a transfer transistor (Tx). In embodiments, substantially full dumping of photocharges may occur. In embodiments, photocharges may be generated in a photodiode which may be are dumped to a floating diffusion region, such that sensitivity of an output image may be maximized. In embodiments, electrical junction region 140 on and/or over first substrate 100 including readout circuit 120 may provide a potential difference between a source and a drain of transfer transistor (Tx) 121. In embodiments, substantially full dumping of photo charges may occur, as illustrated in FIG. 2. In embodiments, unlike when a photodiode may be connected to an N+ junction, embodiments may substantially avoid saturation reduction and/or sensitivity degradation.

According to embodiments, first conductive type connection 147 may be formed between a photodiode and readout circuit 120. In embodiments, a relatively smooth transfer path of photocharges may be created. In embodiments, a dark current source may be minimized, and/or saturation reduction and/or sensitivity degradation may be minimized. In embodiments, an N+ doping region may be formed as first conductive type connection 147 for an ohmic contact on and/or over a surface of P0/N−/P− junction 140. In embodiments, N+ region 147 may be formed to contact N− 143 through P0 145.

According to embodiments, a width of first conductive type connection 147 may be minimized, which may inhibit first conductive type connection 147 from becoming a leakage source. In embodiments, a plug implant may be performed after etching first metal contact 151 a, but embodiments are not limited thereto. In embodiments, an ion implantation pattern may be formed, and/or first conductive type connection 147 may be formed using an ion implantation pattern as an ion implantation mask. In embodiments, an N+ doping may be locally performed on and/or over a contact formation region, for example to minimize a dark signal and/or facilitate formation of an ohmic contact. In embodiments, a Tx source region may be N+ doped.

Figure 3:
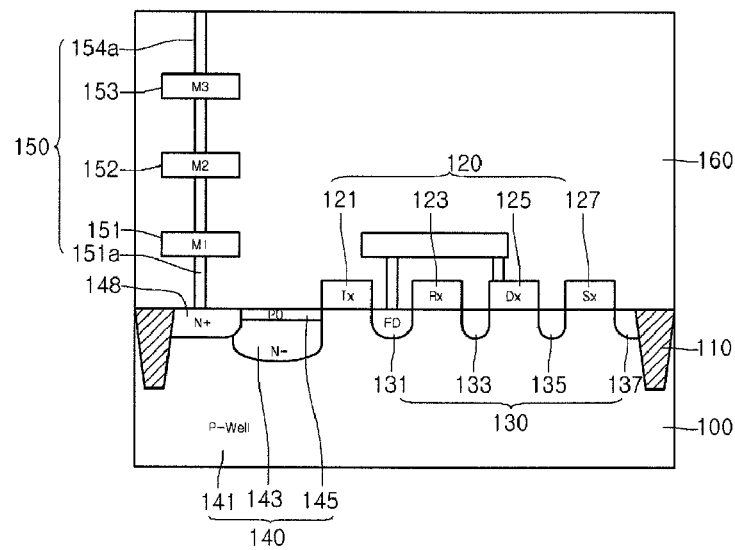

Referring to FIG. 3, a structure of a readout circuit is illustrated. According to embodiments, first conductive type connection 148 may be formed at one side of electrical junction region 140. According to embodiments, N+ connection 148 may be formed at a P0/N−/P− junction 140 for an ohmic contact. A dark signal may increase due to a Si surface dangling bond. A leakage source may be generated during a formation process of N+ connection 148 and/or M1C contact 151a, since an electric field (EF) may be generated over a Si surface due to an operation while a reverse bias is applied to P0/N−/P− junction 140. A crystal defect generated during a contact formation process inside the electric field may become a leakage source. Also, when N+ connection 148 may be formed on and/or over a surface of P0/N−/P− junction 140, an electric field may be generated due to N+/P0 junction 148/145. This electric field may also become a leakage source.

According to embodiments, a layout may include a first contact plug 151 a which may be formed on and/or over an active region substantially not doped with a P0 layer, which may include N+ connection 148 and/or may be connected to N-junction 143. In embodiments, an electric field may not be generated on and/or over a surface of semiconductor substrate 100. In embodiments, dark current may be minimized, for example of a 3D integrated CIS.

Referring back to FIG. 1, interlayer dielectric 160 and/or interconnection 150 may be formed on and/or over semiconductor substrate 100. In embodiments, interconnection 150 may include second metal contact 151a, first metal (M1) 151, second metal (M2) 152, third metal (M3) 153 and/or fourth metal contact 154a, but embodiments are not limited thereto. In embodiments, interconnection 150 may be formed for each unit pixel and/or may be electrically connected to readout circuitry 120. In embodiments, fourth metal contact 154a may be formed, which may be the last interconnection of interconnection 150. In embodiments, interlayer dielectric 160 and/or interconnection 150 may be planarized. A dishing phenomenon may occur by the selectivity of fourth metal contact 154a and/or interlayer dielectric 160.

Figure 4:
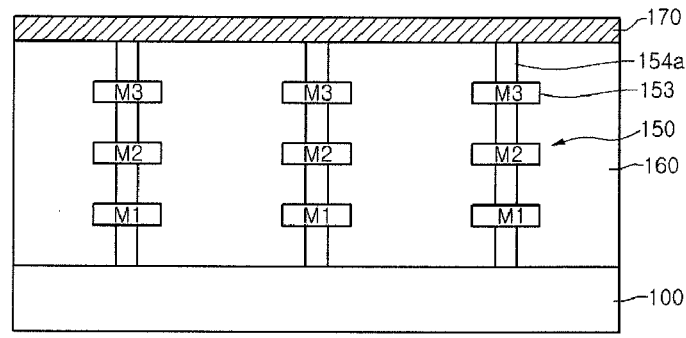

Referring to FIG. 4, first metal layer 170 may be formed on and/or over interlayer dielectric 160. According to embodiments, first metal layer 170 may serve as a junction layer, for example when a photodiode may be bonded to interlayer dielectric 160. For purposes of description, semiconductor substrate 100 and/or readout circuitry 120 may be omitted. In embodiments, first metal layer 170 may include Ti, Ta, Co, Al, Sn, Au, Cu, Pb, and/or Ag. In embodiments, first metal layer 170 may be formed of a combination of materials, for example a combination of at least two of the above-described materials. In embodiments, first metal layer 170 may include a thickness between approximately 0.1 µm and 2.0 µm.

According to embodiments, first metal layer 170 may be formed on and/or over interlayer dielectric 160 which may include interconnection 150. In embodiments, first metal layer 170 may be electrically connected to fourth metal contact 154a. In embodiments, first metal layer 170 may be formed to fill an upper part of fourth metal contact 154a. In embodiments, a loss by a dishing phenomenon may be restored even when a dishing phenomenon occurs on and/or over fourth metal contact 154a.

Figure 5:
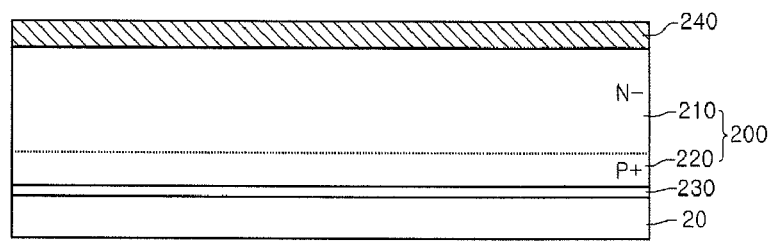

Referring to FIG. 5, photodiode 200 may be formed on and/or over carrier substrate 20. In embodiments, carrier substrate 20 include a mono- and/or poly-crystalline silicon substrate, and/or may be a substrate doped with P-type impurities and/or N-type impurities. According to embodiments, photodiode 200 may have a P-N junction including first doped layer 210 and second doped layer 220. In embodiments, P-type impurities may be ion-implanted on and/or over a relatively deep region of carrier substrate 20 to form second doped layer 220 of photodiode 200. In embodiments, N-type impurities may be ion-implanted on and/or over carrier substrate 20 to form first doped layer 210 of photodiode 200, which may contact second doped layer 220. In embodiments, an ohmic contact layer may be formed to contact first doped layer 210 by ion-implanting high-concentration N-type impurities on and/or over a relatively shallow region of carrier substrate 20.

According to embodiments, first doped layer 210 may be formed including a broader region than that of second doped layer 220. In embodiments, a depletion region may be expanded to maximize generation of photoelectrons.

According to embodiments, second metal layer 240 may be formed on and/or over photodiode 200. In embodiments, second metal layer 240 may be formed of substantially the same material as first metal layer 170. In embodiments, second metal layer 240 may be formed by substantially the same method as first metal layer 170. In embodiments, second metal layer may not be formed.

According to embodiments, hydrogen layer 230 may be formed by implanting hydrogen ions on and/or over a boundary surface between carrier substrate 20 and photodiode 200. In embodiments, hydrogen layer 230 may define a photodiode region by implanting hydrogen ions on and/or over carrier substrate 20 before photodiode 200 may be formed. In embodiments, hydrogen layer 230 may be formed by implanting ions on and/or over carrier substrate 20 at a rate between approximately $2 \times 10^{16}$ atom/cm$^2$ and $1 \times 10^{17}$ atom/cm$^2$.

Figure 6:
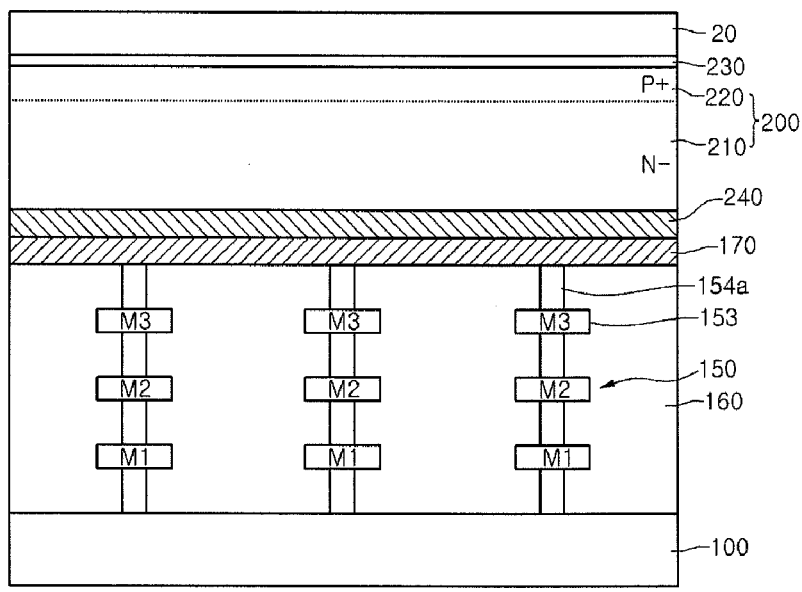

Referring to FIG. 6, carrier substrate 20 may be formed including photodiode 200, and/or may be bonded to semiconductor substrate 100. According to embodiments, bonding between semiconductor substrate 100 and carrier substrate 20 may be performed such that first metal layer 170 faces second metal layer 240. In embodiments, carrier substrate 20 may be rotated by 180 degrees such second metal layer 240 faces downward, and/or a bonding process may be performed. In embodiments, first metal layer 170 and second metal layer 240 may be include substantially the same material, which may improve bonding strength between semiconductor substrate 100 and carrier substrate 20.

According to embodiments, semiconductor substrate 100 and carrier substrate 20 may be bonded through thermal-compression bonding. In embodiments, bonding between semiconductor substrate 100 and carrier substrate 20 may be performed in a vaccum atmosphere including bonding pressure between approximately 1 kN and 100 kN. In embodiments, semiconductor substrate 100 and carrier substrate 20 may be bonded to each other using first metal layer 170 and/or second metal layer 240 as adhesive layers. In embodiments, physical and/or electrical bonding strength of a bonding surface may be maximized. In embodiments, a bonding defect and/or a peeling phenomenon may be minimized.

Figure 7:
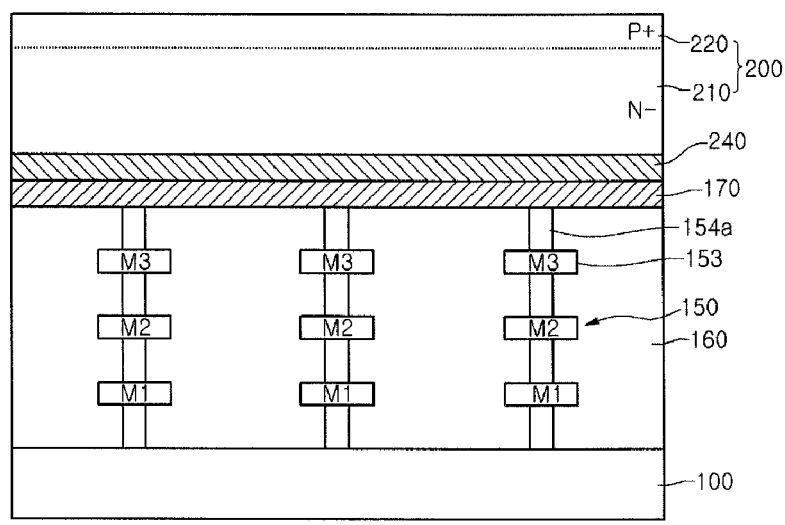

Referring to FIG. 7, carrier substrate 20 may be removed to expose photodiode 200. In embodiments, carrier substrate 20 may be separated from image sensing device 200 at a hydrogen layer 230 through heat treatment and/or mechanical impacts. According to embodiments, carrier substrate 20 may be separated from photodiode 200 at hydrogen layer 230 through a heat treatment process between approximately 300° C. and 600° C. In embodiments, carrier substrate 20 may be separated from photodiode 200 at hydrogen layer 230 through a cleaving process, for example using a blade. In embodiments, carrier substrate 20 may be removed from photodiode 200 to leave photodiode 200 on and/or over semiconductor substrate 100.

Figure 8:
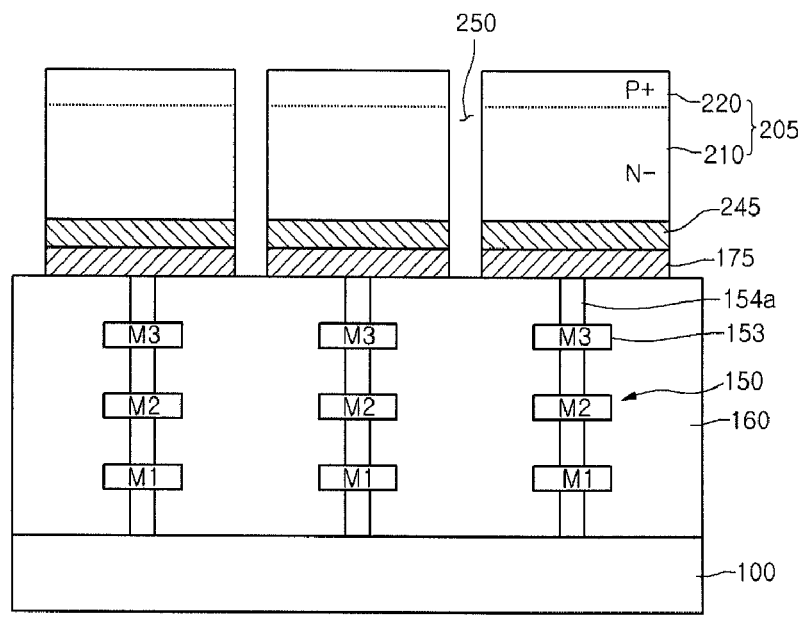

Referring to FIG. 8, pixel isolation trench 250 may be formed through photodiode 200, first metal layer 170 and/or second metal layer 240, which may separate photodiode 200 into unit pixels. According to embodiments, pixel isolation trench 250 may expose a surface of interlayer dielectric 160 between interconnection 150. In embodiments, a hard mask may including an oxide and/or may be formed to selectively expose a surface of photodiode 200 corresponding to interlayer dielectric 160. In embodiments, photodiode 200, first metal layer 170 and/or second metal layer 240 may be selectively etched through a dry and/or wet etching process using a hard mask as an etch mask.

According to embodiments, pixel isolation trench 250 may be formed to selectively expose a surface of interlayer dielectric 160 through photodiode 200, first metal layer 170 and/or second metal layer 240. In embodiments, photodiode pattern 205, first metal pattern 175 and/or second metal pattern 245 may be formed by pixel isolation trench 250 for each unit pixel. In embodiments, photodiode 205, first metal pattern 175 and/or second metal patterns 245 may be separated into unit pixels, and/or may be connected to interconnection 150 formed in each pixel.

According to embodiments, photodiode pattern 205 may be connected to interconnection 150 by first metal pattern 175 and/or second metal pattern 245. In embodiments, transmission efficiency of electrons may be maximized. In embodiments, photodiode pattern 205, first metal pattern 175 and/or second metal pattern 245 may be formed to have substantially the same area.

In embodiments, collection of photocharges generated in photodiode pattern 205 may be facilitated. In embodiments, transmission efficiency of charges may be maximized.

Figure 9:
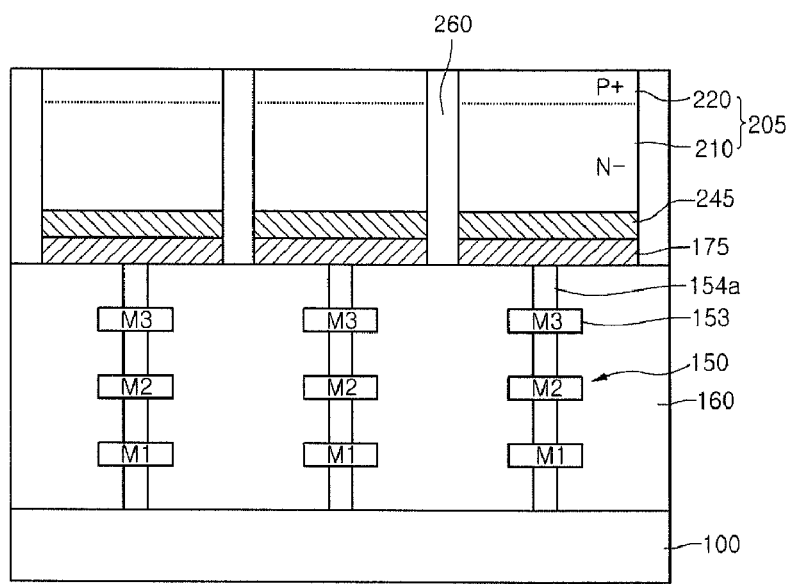

Referring to FIG. 9, pixel isolation layer 260 may be formed by gap-filling an insulating layer on and/or over pixel isolation trench 250. In embodiments, pixel isolation layer 260 may include an oxide and/or a nitride. In embodiments, pixel isolation layer 260 may be formed on and/or over pixel isolation trench 250. In embodiments, adjacent photodiode patterns 205 may be isolated from each other in respective unit pixels. In embodiments, an upper electrode, a color filter and/or a microlens may be formed over photodiode pattern 205.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
providing a semiconductor substrate comprising a readout circuitry;
forming an interlayer dielectric over said semiconductor substrate;
forming an interconnection penetrating said interlayer dielectric connected to said readout circuitry;
forming a first metal pattern over said interlayer dielectric;
forming an image sensing device;
forming a second metal pattern over a surface of said image sensing device;
performing a bonding process over said first metal layer and second metal layer to bond said image sensing device with said semiconductor substrate; and
forming a pixel isolation layer over at least one of said image sensing device, said second metal layer and said first metal layer to separate said image sensing device into pixels.

2. The method of claim 1, wherein forming said image sensing device comprises performing an ion implantation process over a carrier substrate.

3. The method of claim 2, comprising separating said carrier substrate from said image sensing device to expose a surface of said image sensing device.

4. The method of claim 3, wherein said separating comprises at least one of a heat treatment process and a cleaving process.

5. The method of claim 4, wherein:
said heat treatment process comprises using a temperature between approximately 300° C. and 600° C.; and
said cleaving process comprises using a blade.

6. The method according to claim 1, wherein said bonding comprises a thermal-compression bonding process.

7. The method of claim 6, wherein said compression bonding process comprises a bonding pressure between approximately 1 kN and 100 kN.

8. The method of claim 1, wherein said first metal layer and second metal comprise the same conductive material.

9. The method of claim 1, wherein at least one of said first metal layer and said second metal layers comprise at least one of Ti, Ta, Co, Al, Sn, Au, Cu, Pb, and Ag.

10. The method of claim 1, wherein at least one of said first metal layer and said second metal layer are formed through at least one of a Physical Vapor Deposition, Chemical Vapor Deposition, electroplating and electroless plating process.

11. The method of claim 1, comprising forming an image sensor.

* * * * *